United States Patent [19]

Ishihara et al.

[11] Patent Number: 5,045,807
[45] Date of Patent: Sep. 3, 1991

[54] AMPLIFIER CIRCUIT USING FEEDBACK LOAD

[75] Inventors: Noboru Ishihara; Haruhiko Ichino, both of Tokyo, Japan

[73] Assignee: Nippon Telegraph and Telephone Corporation, Tokyo, Japan

[21] Appl. No.: 439,636

[22] Filed: Nov. 20, 1989

[30] Foreign Application Priority Data

Nov. 21, 1988 [JP] Japan .................. 63-294007

[51] Int. Cl.$^5$ ............................. H03F 3/45
[52] U.S. Cl. .................. 330/260; 307/455; 330/294
[58] Field of Search ............ 330/85, 87, 94, 254, 330/260, 293, 294; 307/455, 530

[56] References Cited

U.S. PATENT DOCUMENTS

| | | | |
|---|---|---|---|
| 2,810,025 | 10/1957 | Clements | 330/85 X |
| 3,399,357 | 8/1968 | Weilerstein | 330/260 |
| 3,466,630 | 9/1969 | Mayne et al. | 307/530 X |
| 3,796,896 | 3/1974 | Fulton et al. | 307/455 X |
| 3,927,382 | 12/1975 | Oki | 330/254 |

OTHER PUBLICATIONS

"Computer Aided Design of a 1 GHz Bandwidth Monolithic Integrated Amplifier", H. Hillbrand et al. ESSCI-RC, 1977, pp. 122-124.

"Bipolar High-Gain Limiting Amplifier IC for Optical-Fiber Receivers Operating Up to 4 Gbit/s", R. Reimann et al., IEEE Journal of Solid-State Circuits, vol. SC-22, No. 4, Aug. 1987.

"Monolithic Integration of UHF Amplifiers", 1973 IEDM Technical Digest (1973), pp. 232-235.

Primary Examiner—James B. Mullins
Attorney, Agent, or Firm—Blakely, Sokoloff, Taylor & Zafman

[57] ABSTRACT

An amplifier circuit of this invention includes a first-stage amplifier, an amplifier element connected to the output terminal of the first-stage amplifier as a feedback load, and a further amplifier element connected between the output and input terminals of the amplifier element, and performs negative feedback through a load of the first-stage amplifier. As the amplifier element, a transistor is used, and as the further amplifier element, an emitter-follower transistor is used.

2 Claims, 15 Drawing Sheets

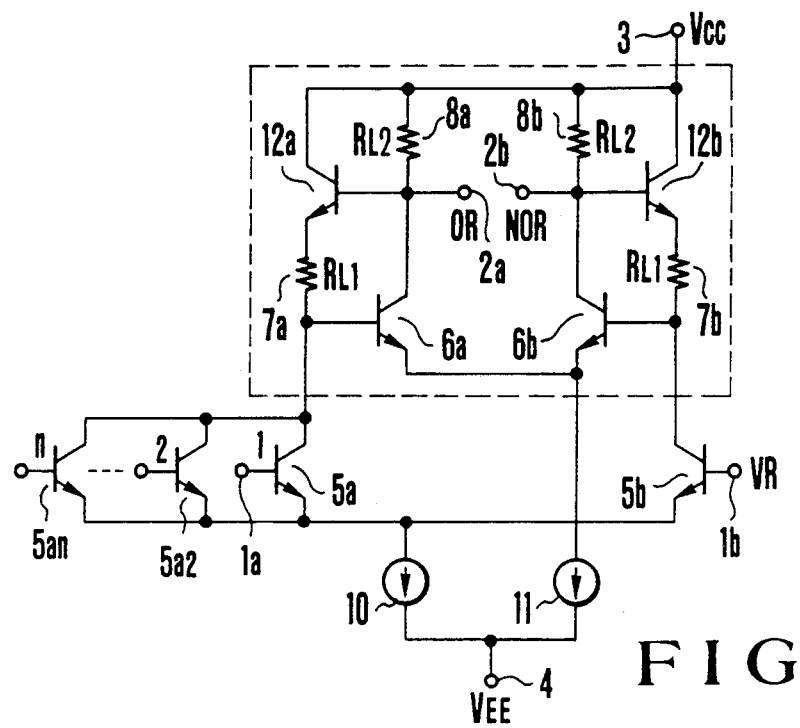
F I G.11
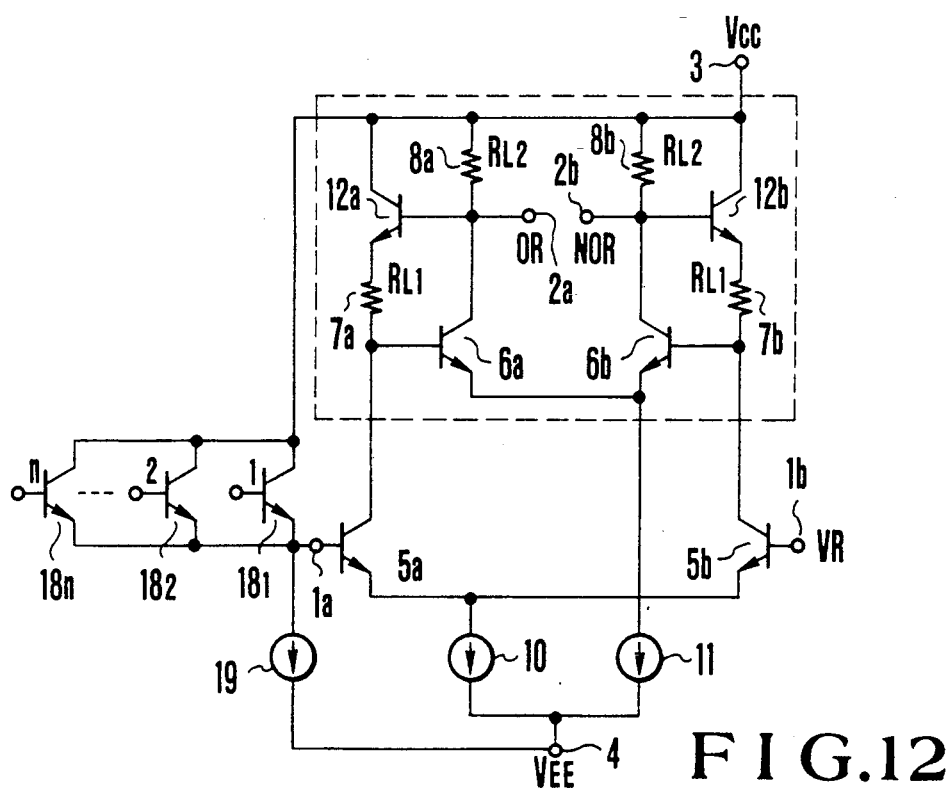
F I G.12

AMPLIFIER CIRCUIT USING FEEDBACK LOAD

BACKGROUND OF THE INVENTION

The present invention relates to an amplifier circuit using a feedback load.

FIG. 1 is a circuit diagram showing a conventional wide-band feedback type differential amplifier circuit (H. Hillbrand, J. Gruber and P. Russer, "Computer Aided Design of a 1 GHz Band-width Monolithic Integrated Amplifier", ESSCI-RC, 1977, pp. 122–124).

Referring to FIG. 1, reference numerals 1a and 1b denote input terminals for receiving input signals $V_{in}$ and $\overline{V}_{in}$; 2a and 2b, output terminals for outputting output signals $V_{out}$ and $\overline{V}_{out}$; 3, a high-potential terminal for receiving a potential $V_{CC}$; 4, a low-potential power supply terminal for receiving a potential $V_{EE}$; 5a and 5b, a pair of input differential transistors as a first pair of differential transistors; 6a and 6b, a pair of output differential transistors as a second pair of differential transistors; 7a and 7b, and 8a and 8b, load resistors having resistances $R_{L1}$ and $R_{L2}$, respectively; 9a and 9b, load capacitors having a capacitance $C_L$; and 10 and 11, first and second current supply circuits for supplying currents $I_1$ and $I_2$.

The circuit shown in FIG. 1 is constituted by the pair of input differential transistors 5a and 5b connected to the load resistors 7a and 8a, and 7b and 8b as loads, respectively, and the pair of output differential transistors 6a and 6b connected to the load resistors 8a and 8b as loads. As the characteristic feature of this circuit, the collectors of the transistors 6a and 6b are connected to their bases through the load resistors 7a and 7b, respectively. Collector signals of the transistors 6a and 6b are fed back to their bases in opposite phases through the load resistors 7a and 7b, in other words, feedback loads are used for the transistors 5a and 5b, thereby realizing a wide-band operation. If transconductances of the transistors 5a and 5b, and 6a and 6b are represented by gm1 and gm2, base resistances are represented by rb1 and rb2, input capacitances are presented by $C\pi 1$ and $C\pi 2$, and an angular frequency is represented by $\omega$, a voltage gain $A_V$ of this conventional circuit is given by:

$$A_V = \frac{gm1 \cdot gm2 \cdot R_{L1} \cdot R_{L2}}{(1 + gm2 \cdot R_{L2})(1 + j\omega a)(1 + j\omega b)(1 + j\omega c)} \quad (1)$$

where a is the time constant at the bases of the transistors 5a and 5b, b is the time constant at the bases of the transistors 6a and 6b, and c is the time constant at the collectors of the transistors 6a and 6b, and these constants are respectively given by:

$$a = C\pi 1 \cdot rb1 \quad (2)$$

$$b = \{C\pi 2 \cdot (R_{L1} + R_{L2} + rb2)/(1 + gm2 \cdot R_{L2})\} \cdot \quad (3)$$

$$\{(1 + j\omega C_L \cdot R_{L2})/(1 + j\omega c)\}$$

$$c = C_L \cdot R_{L2}/(1 + gm2 \cdot R_{L2}) \quad (4)$$

$$c = C_L \cdot R_{L2}/(1 + gm2 \cdot R_{L2}) \quad (4)$$

The gain of the circuit shown in FIG. 1 in a low-frequency mode is approximated by $gm1 \cdot R_{L1}$ from equation (1). The gain in a high-frequency mode is decreased as a frequency increases in accordance with the time constants a, b, and c. However, as can be seen from equations (3) and (4), since the time constants of the bases and collectors of the transistors 6a and 6b can be reduced to $1/(1+gm2 \cdot R_{L2})$ by a feedback effect, a wide-band operation is allowed as compared to a conventional differential amplifier circuit. The time constant b given by equation (3) has an imaginary number component. The imaginary number component is increased as the capacitances $C_L$ of the load capacitors 9a and 9b are increased, and operates to cause peaking in frequency characteristics. For this reason, the capacitances $C_L$ of the load capacitors 9a and 9b are optimized, thus achieving a wider-band operation.

FIG. 2(a) is a graph showing simulation results of frequency characteristics of the circuit shown in FIG. 1. In FIG. 2(a), a frequency is plotted along the abscissa, and a gain is plotted along the ordinate. A plurality of characteristics 21, 22, 23, and 24 are obtained by changing the capacitance $C_L$ of the load capacitor to 0.2 pF, 0.1 pF, 0.05 pF, and 0. As can be seen from the graph, peaking characteristics can be provided by increasing the capacitance $C_L$, and the capacitance $C_L$ is optimized to realize wide-band characteristics. For this reason, wide-band characteristics can be obtained by utilizing an input capacitance or wiring capacitance of the output-side circuit. Note that a bipolar transistor having a high-frequency cutoff frequency of 60 GHz was assumed for simulation.

However, the circuit shown in FIG. 1 suffers from the following drawbacks.

Since bias currents from two transistors, i.e., 5a and 6a, and 5b and 6b are flowed into the load resistors 8a and 8b, respectively, tradeoff (the relationship that when one is established, the other cannot be established) between two differential circuit design occurs, and it is not easy to optimize circuit constants.

Since the gain of the circuit shown in FIG. 1 is determined by $gm1 \cdot R_{L1}$, as described above, when this circuit is applied to a variable gain amplifier circuit, it can be realized by controlling gm1 by changing a current value $I_1$ of the current source circuit. Thus when DC direct coupling is to be realized, DC potentials at the output terminals 2a and 2b are undesirably changed upon control of the current value $I_1$.

Furthermore, the amplitude of the output signal of the circuit shown in FIG. 1 is determined by $R_{L1} \cdot I_1$, and may be applied to a limiter amplifier circuit. When the current $I_1$ of the current source circuit 10 is changed to allow adjustment of the amplitude of the output signal, the DC potentials at the output terminals 2a and 2b are varied in the same manner as in the variable gain amplifier circuit.

Since $R_{L1}$ and $R_{L2}$ are directly coupled to each other, when a signal large enough to cause a switching operation (logic operation) is input to the input terminals 1a and 1b, the base-collector capacitance is largely changed due to a change in base-collector voltage of the transistors 6a and 6b. Thus, an output waveform $S_2$ is distorted, as shown in FIG. 2(b). For this reason, the circuit shown in FIG. 1 cannot be applied to a high-speed logic circuit. Note that $S_1$ denotes an input waveform.

Furthermore, in monolithic amplifier circuits which will suffer from a variation in manufacturing, peaking characteristics tend to vary, and optimal frequency characteristics are not easy to obtain.

SUMMARY OF THE INVENTION

It is, therefore, a principal object of the present invention to provide an amplifier circuit having a wider-band feedback load than in a conventional circuit.

It is another object of the present invention to provide an amplifier circuit which can adjust a peaking amount, and has a wider-band feedback load than in a conventional circuit.

It is still another object of the present invention to provide an amplifier circuit which allows easy DC bias design.

It is still another object of the present invention to provide an amplifier circuit having a feedback load which can perform DC direct coupling.

It is still another object of the present invention to provide an amplifier circuit having a feedback load which can perform DC direct coupling, and can be applied to a variable gain amplifier circuit.

It is still another object of the present invention to provide an amplifier circuit having a feedback load which can perform DC direct coupling, and can arbitrarily set an output level.

It is still another object of the present invention to provide an amplifier circuit having a feedback load which can perform DC direct coupling, can arbitrarily set an output level, and can be applied to a limiter amplifier circuit and a logic circuit.

It is still another object of the present invention to provide an amplifier circuit having a wide-band feedback load which can be applied to a decision circuit capable of performing a highly sensitive, high-speed operation.

In order to achieve the above objects, an amplifier circuit of the present invention comprises a first-stage amplifier, an amplifier element connected to the output terminal of the first-stage amplifier as a feedback load, and a further amplifier element connected between the output and input terminals of the amplifier element, and performs negative feedback through a load of the first-stage amplifier.

According to the present invention, there is provided an amplifier circuit using a feedback load, comprising: a first-stage amplifier including a 3-terminal first amplifier element having an input terminal and two output terminals; and a feedback load for the first-stage amplifier, wherein the input terminal of the first amplifier element receives an input signal, and one output terminal of the first amplifier element is connected to a first potential, the feedback load comprises 3-terminal second and third amplifier elements each having an input terminal and two output terminals and first and second impedance elements, the input terminal of the second amplifier element and the first impedance element are connected to the other output terminal of the first amplifier element, one output terminal of the second amplifier element is connected to a second potential, and the other output terminal of the second amplifier element is connected to a third potential through the second impedance element, the input terminal of the third amplifier element is connected to the other output terminal of the second amplifier element, one output terminal of the third amplifier element is connected to a fourth potential, and the other output terminal of the third amplifier element is connected to the first impedance element, and an output is extracted from a connecting node between the second impedance element and the other output terminal of the second amplifier element.

BRIEF DESCRIPTION OF THE DRAWINGS

FIGS. 11 to 16 are circuit diagrams showing logic circuits according to other embodiments of the present invention.

DESCRIPTION OF THE PREFERRED EMBODIMENTS

A difference between the characteristic feature of the present invention and the prior art will be described below. The present invention is characterized in that emitter-follower transistors are added to a feedback circuit portion, and have impedance and bias conditions of the feedback circuit portion different from those of the prior art.

Figure 3:
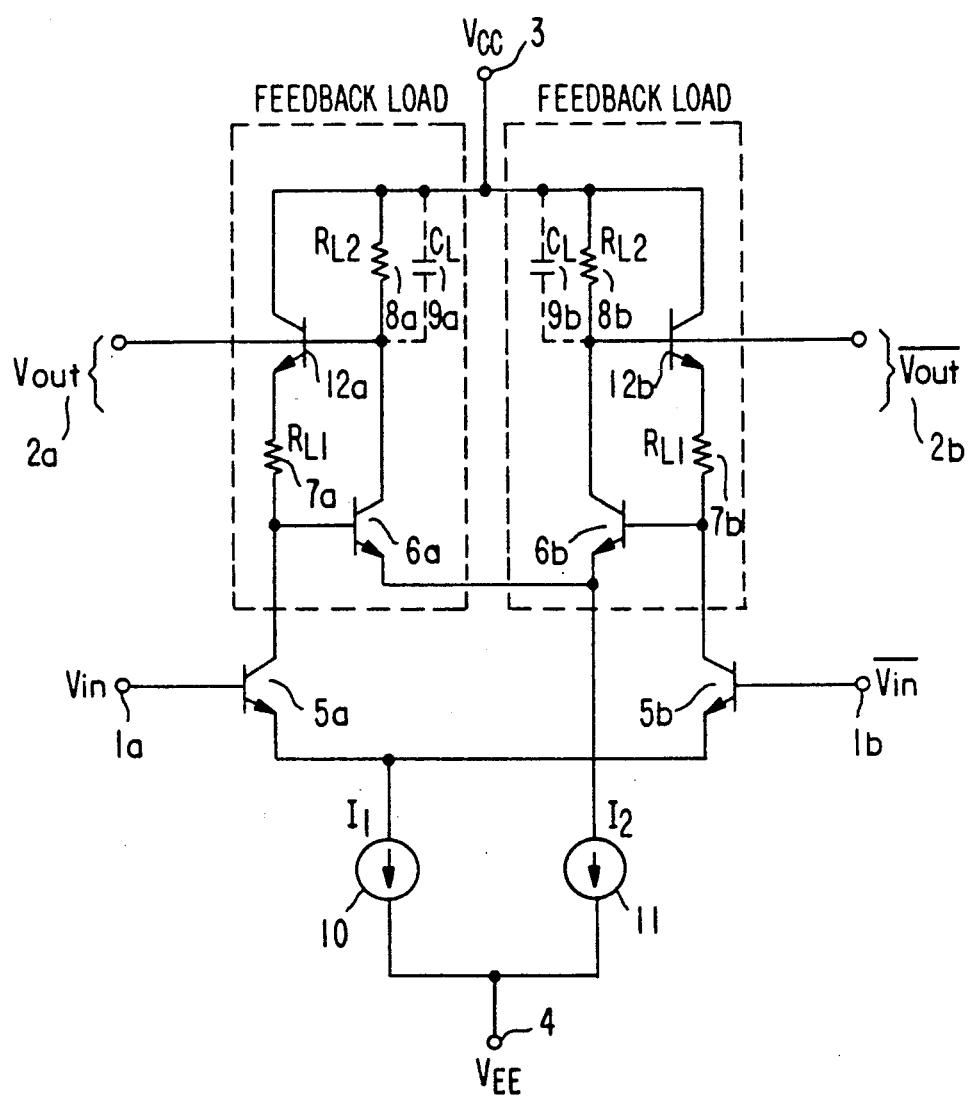
FIG. 3 is a circuit diagram showing a differential amplifier circuit as an embodiment of an amplifier circuit having a feedback load according to the present invention.

FIG. 3 is a circuit diagram showing an embodiment of a differential amplifier circuit according to the present invention. Referring to FIG. 3, reference numerals 1a and 1b denote input terminals for receiving input signals $V_{in}$ and $\overline{V}_{in}$; 2a and 2b, output terminals for outputting output signals $\overline{V}_{out}$ and $V_{out}$; 3, a high-potential power supply terminal for receiving a potential $V_{CC}$; 4, a low-potential power supply terminal for receiving a potential $V_{EE}$; 5a and 5b, a pair of input differential transistors as a first pair of differential transistors, 6a and 6b, a pair of output differential transistors as a second pair of differential transistors; 7a and 7b, and 8a and 8b, load resistors having resistances $R_{L1}$ and $R_{L2}$, respectively, 9a and 9b, load capacitors having a capacitance $C_L$; 10 and 11, first and second current supply circuits for supplying currents $I_1$ and $I_2$; and 12a and 12b, feedback emitter-follower transistors. The transistors 12a and 12b and the load resistors 7a and 7b constitute a feedback means.

Figure 1:
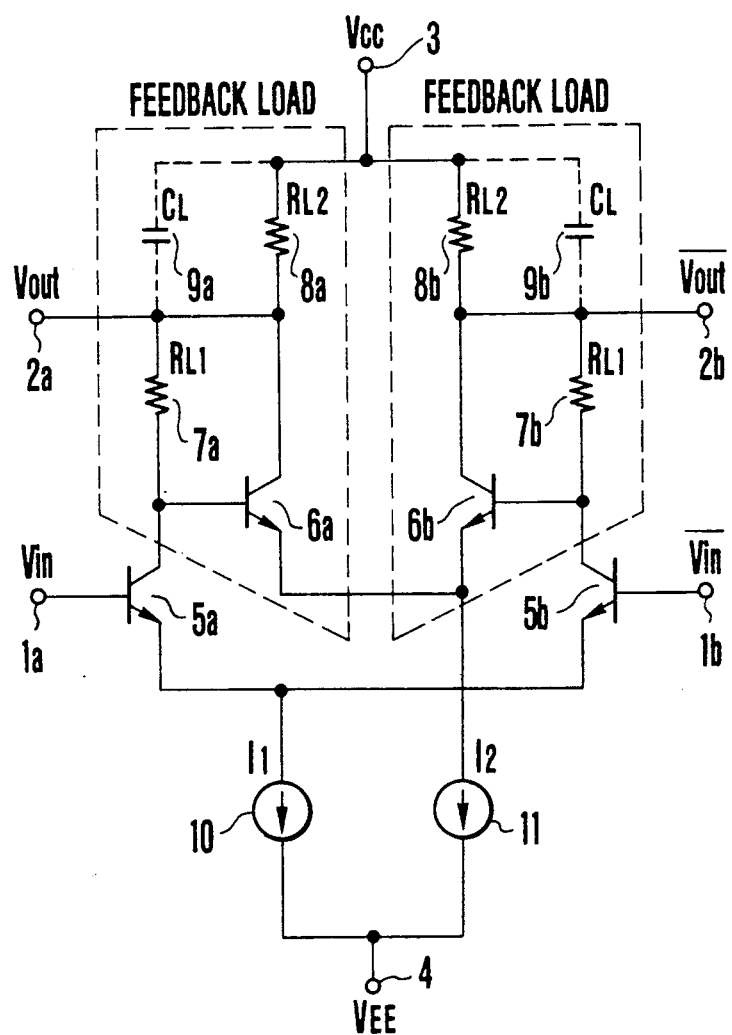
FIG. 1 is a circuit diagram showing a conventional amplifier circuit having a feedback load.

In this embodiment, the emitter-follower transistors 12a and 12b are added to the conventional circuit shown in FIG. 1, so that a wider-band operation than in the conventional circuit is achieved by the buffer effect of the transistors 12a and 12b. In addition, the circuit shown in FIG. 3 is arranged in a DC manner so that currents flowed through the transistors 5a and 5b are not flowed through the load resistors 8a and 8b, thus facilitating DC design of the circuit.

If transconductances of the transistors 5a and 5b, and 6a and 6b are represented by gm1 and gm2, base resistances are represented by rb1 and rb2, input capacitances are presented by $C\pi 1$ and $C\pi 2$, and an angular frequency is represented by $\omega$, a voltage gain $A_V$ of the circuit shown in FIG. 3 is given by:

$$A_V = \frac{gm1 \cdot gm2 \cdot R_{L1} \cdot R_{L2}}{(1 + gm2 \cdot R_{L2})(1 + j\omega a)(1 + j\omega b)(1 + j\omega c)} \quad (5)$$

where a is the time constant at the bases of the transistors 5a and 5b, b is the time constant at the bases of the transistors 6a and 6b, and c is the time constant at the collectors of the transistors 6a and 6b, and these constants are respectively given by:

$$a = C\pi 1 \cdot rb1 \quad (6)$$

$$b = \{C\pi 2 \cdot (R_{L1} + rb2)/(1 + gm2 \cdot R_{L2})\} \cdot \{(1 + j\omega C_L \cdot R_{L2})/(1 + j\omega c)\} \quad (7)$$

$$c = C_L \cdot R_{L2}/(1 + gm2 \cdot R_{L2}) \quad (8)$$

The gain of the circuit shown in FIG. 3 in a low-frequency mode is approximated by $gm1 \cdot R_{L1}$ from equation (5) in the same manner in the conventional circuit. The gain in a high-frequency mode is decreased as a frequency increases in accordance with the time constants a, b, and c. As can be seen from equations (7) and (8), since the time constants of the bases and collectors of the transistors 6a and 6b can be reduced to $1/(1 + gm2 \cdot R_{L2})$ due to the feedback effect, a wider-band operation can be realized as compared to a conventional differential amplifier circuit. Upon comparison between equation (3) of the conventional circuit shown in FIG. 1 and equation (7), since $R_{L2}$ is eliminated in equation (7) in the circuit of this embodiment, wider-band characteristics than in the conventional circuit shown in FIG. 1 can be realized in principle. This advantage can be obtained by utilizing the fact that impedances from the emitters of the transistors 12a and 12b are low.

Figure 2A:
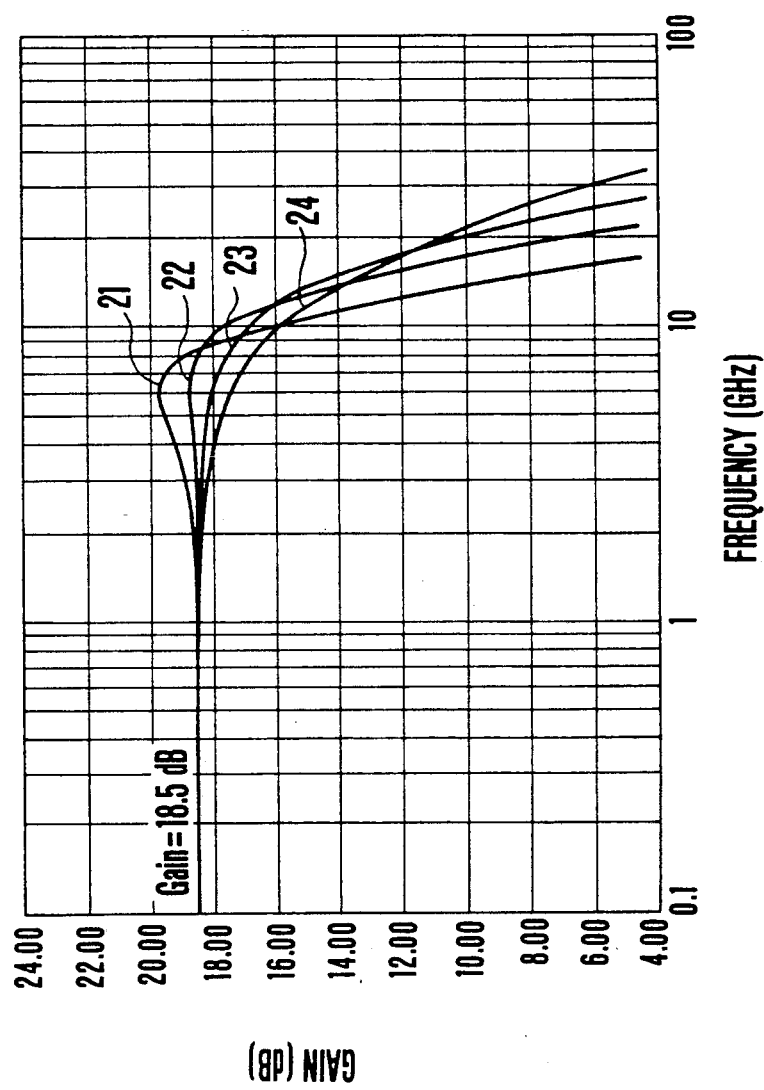
FIG. 2(a) is a graph showing gain-frequency characteristics of the conventional circuit.
Figure 2B:
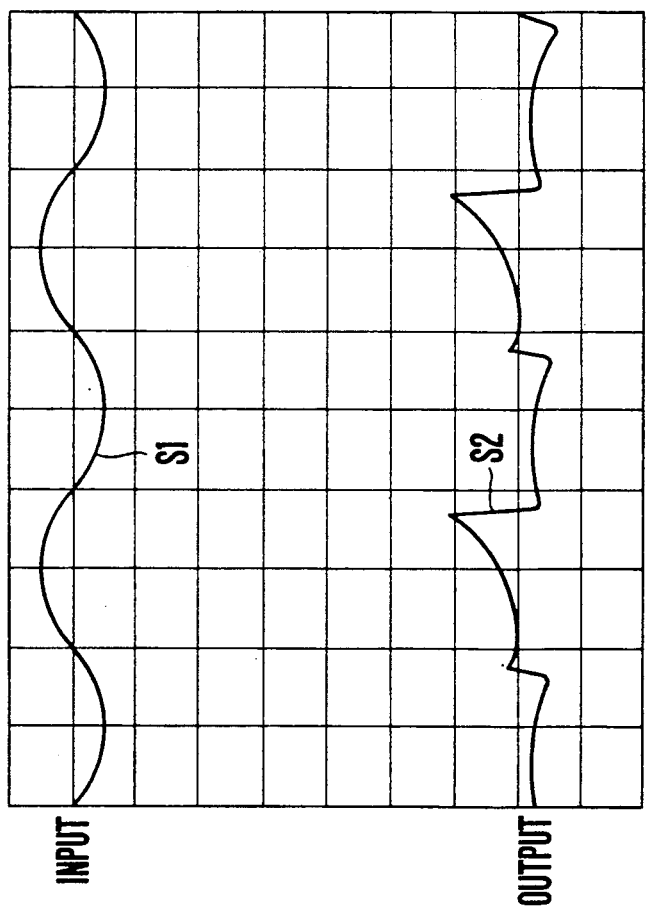
FIG. 2(b) is a graph showing input and output waveforms of the conventional circuit.
Figure 4:
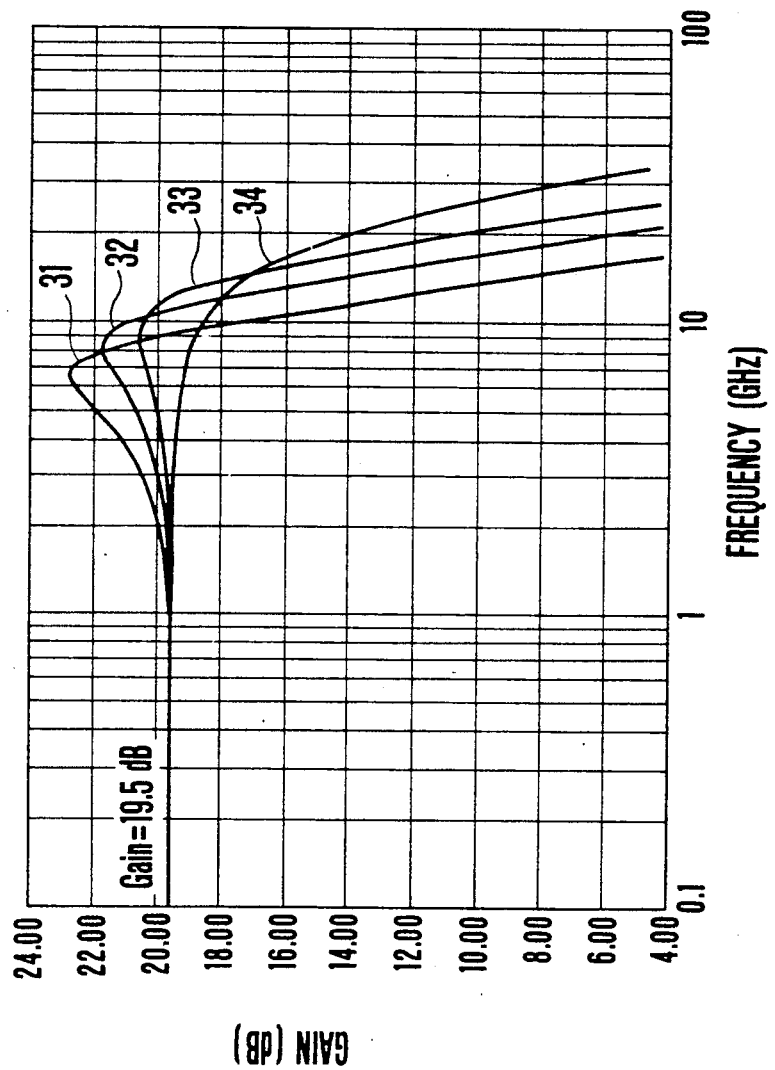
FIG. 4 is a graph showing gain-frequency characteristics of the circuit of the present invention.

FIG. 4 is a graph showing simulation results of frequency characteristics of the circuit of this embodiment. In FIG. 4, a frequency is plotted along the abscissa, and a gain is plotted along the ordinate. A plurality of characteristics 31, 32, 33, and 34 are obtained by changing the capacitance $C_L$ of the load capacitor to 0.2 pF, 0.1 pF, 0.05 pF, and 0. In this simulation, the resistance $R_{L1}$ of the resistors 7a and 7b = 500 Ω, the resistance $R_{L2}$ of the resistors 8a and 8b = 500 Ω, $I_1 = 3$ mA, $I_2 = 3$ mA, and transistors used had a high-frequency cutoff frequency $f_T = 60$ GHz and a current gain $\beta = 50$. Upon comparison with the frequency characteristics of the conventional circuit shown in FIG. 1 (FIG. 2(a)), a band-width can be improved by about 25% in the circuit of this embodiment. Like in the conventional circuit shown in FIG. 1, a band-width can be further increased by peaking due to the effect of the capacitance $C_L$. For this reason, by utilizing an input capacitance or wiring capacitance of the output-side circuit, characteristics over a wider band can be obtained.

Furthermore, the circuit of this embodiment has the following advantages in addition to the band characteristics as compared with the conventional circuit.

(1) The current gain $\beta$ of a bipolar transistor is normally 100 or more. For this reason, currents flowed in the bases of the transistors 12a and 12b are as small as $1/\beta$ the collector currents. The bias current of a differential pair consisting of the transistors 5a and 5b and the bias current of a differential pair consisting of the transistors 6a and 6b are separated by the transistors 12a and 12b. For this reason, bias design and gain design of the differential pairs can be independently made, thus allowing easier design than the conventional circuit.

Note that in an ultra-high speed transistor, may often be decreased to be equal to or smaller than 100 due to tradeoff with an operating speed. In principle, however, if $\beta$ of 1 or more is provided, an effect of improving the conventional circuit can be obtained.

(2) Peaking effect can be achieved to perform a wider-band operation by effectively utilizing the load capacitance composed of small input capacitance to the next stage or wiring capacitance, as the output impedance at the output terminals is increased to be greater than that of conventional circuits due to the buffer effect of the transistors 12a and 12b.

Figure 5:
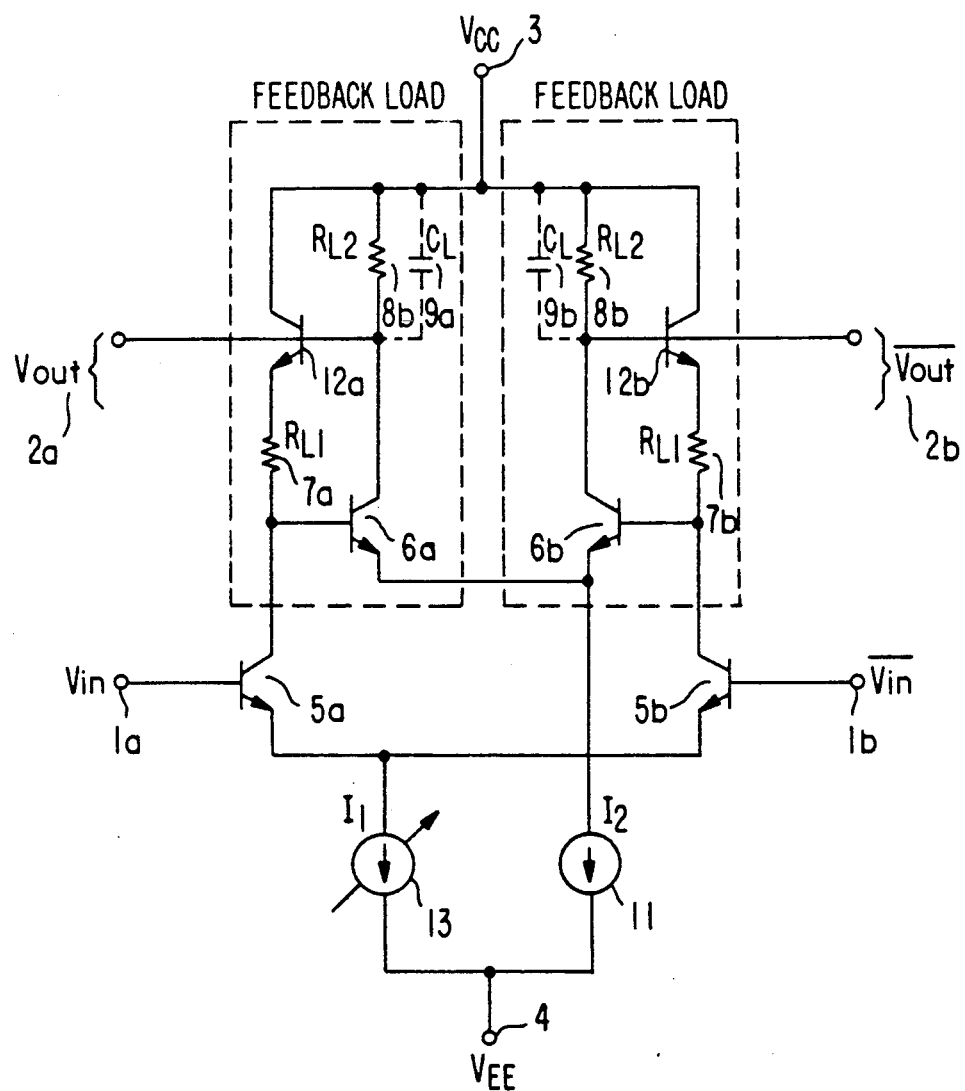
FIG. 5 is a circuit diagram of a variable gain amplifier circuit according to another embodiment of the present invention.
Figure 6:
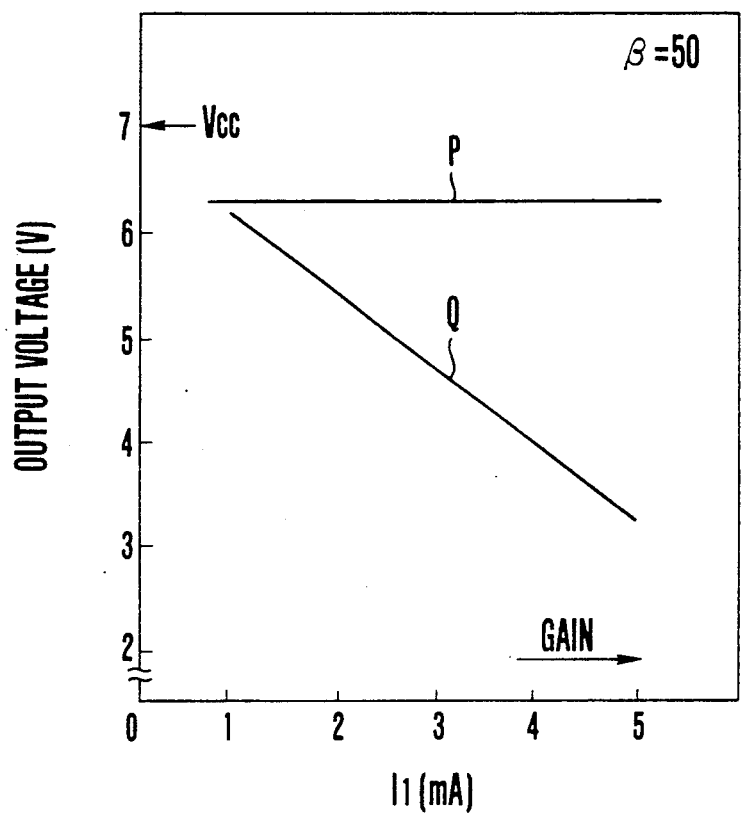
FIG. 6 is an $I_1$-output voltage graph of FIG. 5.

(3) FIG. 5 shows the second embodiment of the present invention. In this embodiment, the present invention is applied to a variable gain amplifier circuit. The circuit shown in FIG. 5 employs a variable current source circuit 13 in place of the first current source circuit in the circuit shown in FIG. 3. A current $I_1$ flowed through a differential pair consisting of transistors 5a and 5b is controlled to change the transconductance gm1 of the transistors 5a and 5b, thereby realizing a variable gain function. In this circuit, even if the current $I_1$ is changed, bias voltages at output terminals 2a and 2b will not be changed (characteristic curve P) due to the emitter follower effect of transistors 12a and 12b unlike in a conventional circuit (characteristic curve Q) shown in the graph of FIG. 6. For this reason, the circuit shown in FIG. 5 can be applied to a multi-stage amplifier circuit realized by DC direct coupling. The circuit arrangement shown in FIG. 5 is suitable for a monolithic IC with which a large-capacitance capacitor is difficult to realize. Note that reference numerals 9a' and 9b' denote load capacitors $C_L'$.

Figure 7:
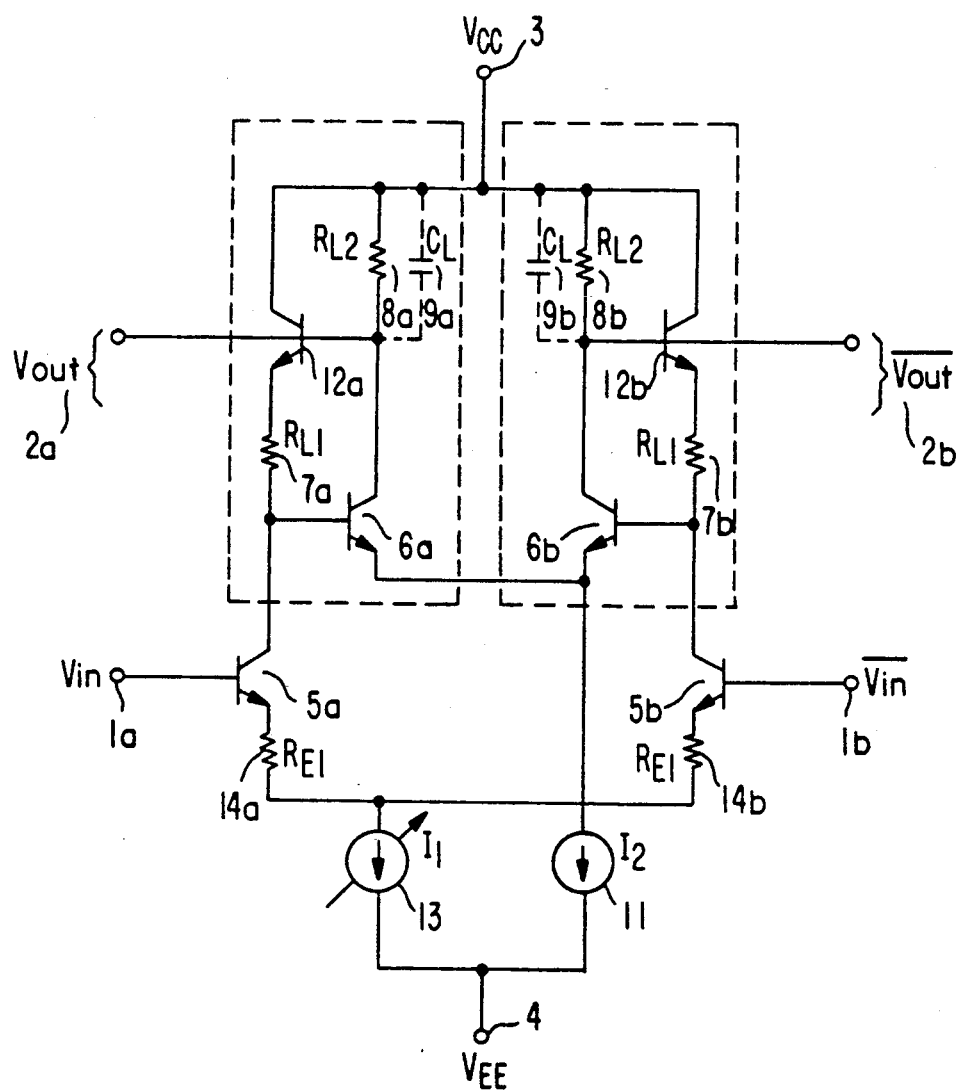
FIG. 7 is a circuit diagram of a limiter amplifier circuit which can perform output amplitude control, according to still another embodiment of the present invention.
Figure 8:
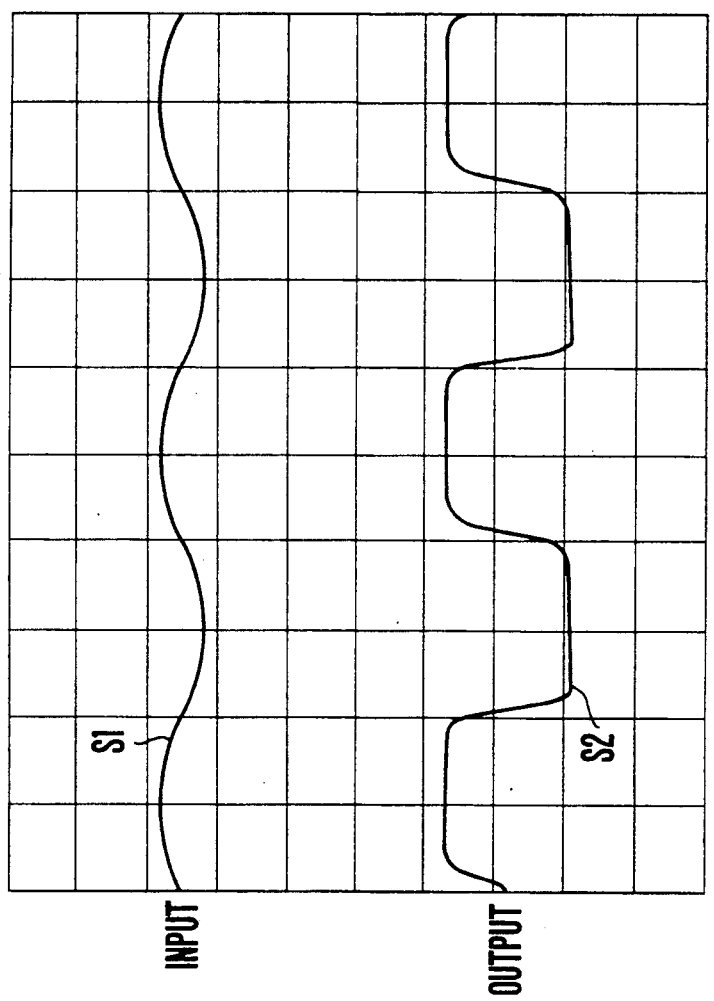
FIG. 8 is a graph showing input and output waveforms of the circuit shown in FIG. 7.

(4) FIG. 7 is a circuit diagram showing the third embodiment of the present invention. In this embodiment, the present invention is applied to a limiter amplifier circuit which can control an output amplitude. The circuit shown in FIG. 7 additionally employs resistors 14a and 14b having a resistance $R_{E1}$ connected to the emitters of transistors 5a and 5b in the circuit shown in FIG. 3, and also employs a variable current source circuit 13 in place of the first current source circuit. The gain of the circuit shown in FIG. 7 is given by $R_{L1}/R_{E1}$ due to the feedback effect of the resistors 14a and 14b, and its output amplitude is given by $I_1 \cdot R_{L1}$. For this reason, the circuit shown in FIG. 7 has a function of adjusting an output amplitude by controlling a current $I_1$ while the gain is kept constant. In this circuit, even if the current $I_1$ is changed, bias voltages at output terminals 2a and 2b will not be changed due to the emitter follower effect of transistors 12a and 12b as same as embodiment shown in FIG. 5 unlike in the conventional circuit shown in FIG. 1. Therefore, the circuit shown in FIG. 7 can be applied to a multi-stage amplifier circuit realized by DC direct coupling. The circuit arrangement shown in FIG. 7 is suitable for a monolithic IC with which a large-capacitance capacitor is difficult to realize. FIG. 8 shows input and output waveforms S1 and S2 when the circuit shown in FIG. 7 is used. As can be seen from these input and output waveforms, even if an input signal is increased, an output waveform can be prevented from being distorted due to the effect of the transistors 12a and 12b. Since the base-emitter voltage of the transistors 12a and 12b is applied as a reverse-bias voltage of the base-collector junction of the transistors 6a and 6b, even if a signal large enough to cause a switching operation is input to the input terminals 1a and 1b, a change in base-collector capacitance of the transistors 6a and 6b is smaller than in the conventional circuit.

Figure 9:
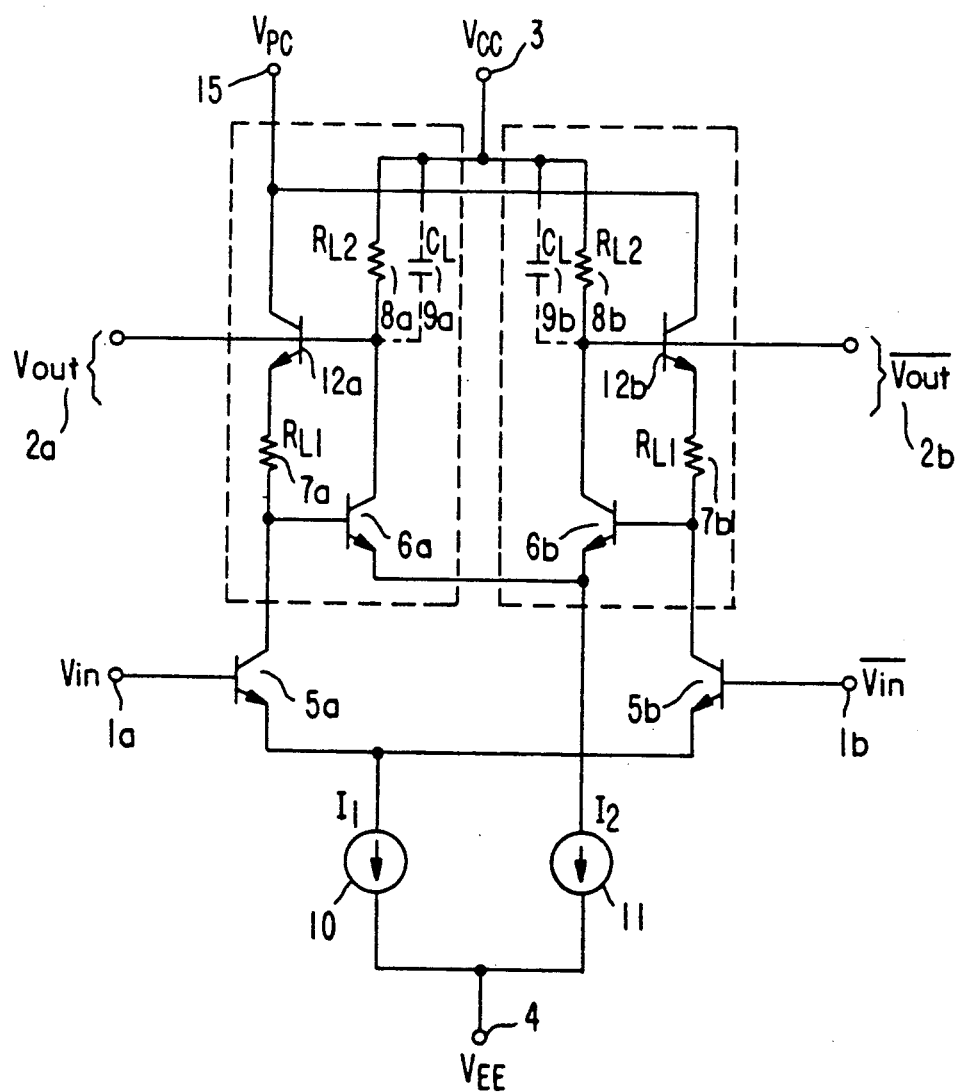
FIG. 9 is a circuit diagram of a wide-band amplifier circuit which can change peaking characteristics, according to still another embodiment of the present invention.

(5) FIG. 9 shows the fourth embodiment of the present invention. In this embodiment, the present invention is applied to a wide-band amplifier circuit which can adjust a peaking amount. In the circuit shown in FIG. 9, the collectors of transistors 12a and 12b in the circuit shown in FIG. 3 are separated from the high-potential power supply terminal 3, and are connected to a control terminal 15, so that an arbitrary voltage can be independently applied. A voltage VPC applied to the control terminal 15 is controlled to adjust a junction capacitance as a load capacitance component between the bases and collectors of the transistors 12a and 12b, thereby adjusting a peaking amount. In the conventional circuit arrangement shown in FIG. 1, it is difficult to adjust the peaking amount. In addition, a monolithic amplifier circuit is assumed to suffer from a variation in the manufacture, and a circuit correction is not easy. Therefore, the circuit shown in FIG. 9 is effective for obtaining optimal band-width characteristics.

Figure 10:
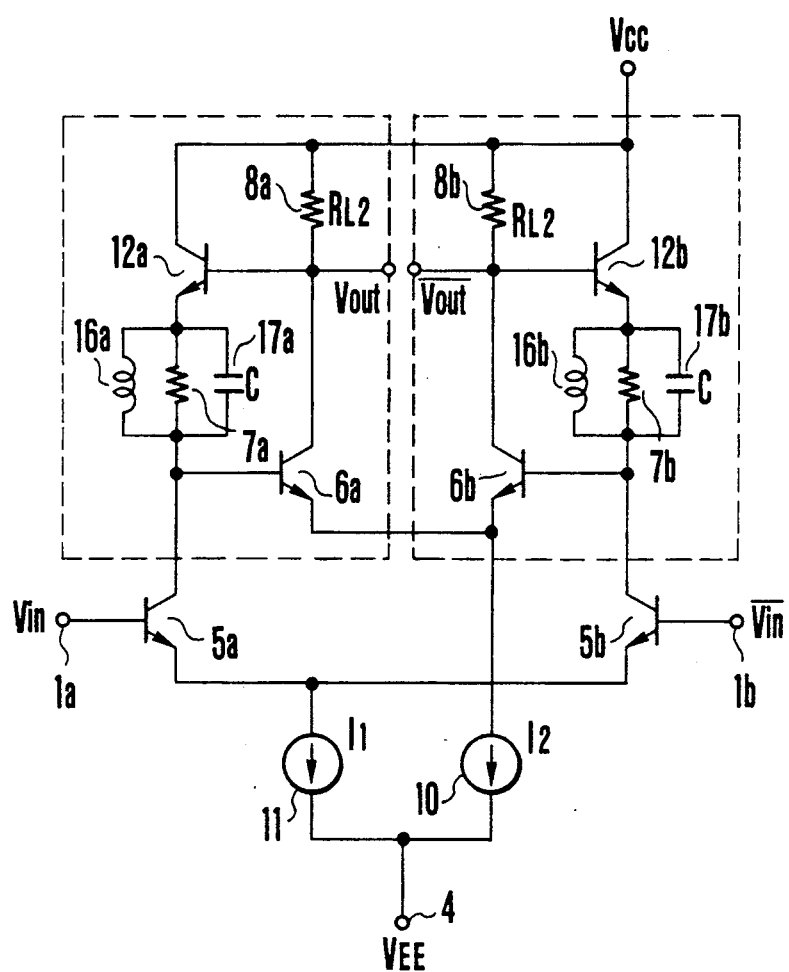
FIG. 10 is a circuit diagram showing a tuning amplifier circuit whose tuning characteristics are improved, according to still another embodiment of the present invention.

FIG. 10 shows the fifth embodiment of the present invention. In particular, when the present invention is applied to a tuning amplifier circuit, a coil 16a having an inductance L and a capacitor 17a having a capacitance C are connected in parallel with a load resistor 7a of a transistor 5a, and a coil 16b having an inductance L and a capacitor 17b having a capacitance C are connected in parallel with a load resistor 7b of a transistor 5b, thereby constituting parallel resonance circuits. With this arrangement, the circuit shown in FIG. 10 can have tuning characteristics. In this circuit arrangement, since the load resistors 8a and 7a, and 8b and 7b are separated by transistors 12a and 12b, respectively, degradation of Q due to the load resistors 8a and 8b in the tuning characteristics can be prevented.

FIGS. 11 to 16 show other embodiments of the present invention. In these embodiments, the present invention is applied to logic circuits. In this case, FIG. 11 shows an n-input OR/NOR gate. The circuit shown in FIG. 11 has transistors $5a_2$ to $5a_n$ which are connected in parallel between the collector and emitter of a transistor 5a. N digital inputs are applied to the bases of these transistors, and a transistor 16 receives a reference voltage $V_R$. Other arrangements are the same as those in FIG. 3. In this manner, an OR output appears at an output terminal 2a, and a NOR output appears at an output terminal 2b.

FIG. 12 shows an emitter-follower type OR/NOR gate. The circuit shown in FIG. 12 has an input terminal 1a connected to the base of a transistor 5a, and transistors $18_1$ to $18_n$ whose collectors are commonly connected to a high-potential power supply terminal 3. The bases of the transistors $18_1$ to $18_n$ receive digital inputs. The emitters of these transistors are connected to a potential $V_{EE}$ through a current source 19.

Figure 13:
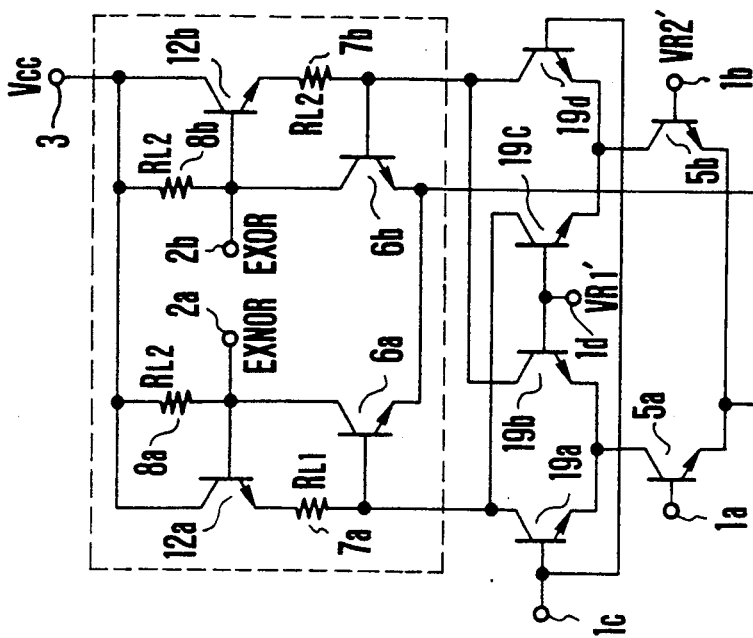

FIG. 13 shows an EXOR/EXNOR gate. In this circuit, differential pairs of transistors 19a and 19b, and 9c and 19d are additionally connected between transistors 5a and 5b and load resistors 7a and 7b, respectively. The common emitter of the transistors 19a and 19b is connected to the collector of the transistor 5a. Similarly, the common emitter of the transistors 19c and 19d is connected to the collector of the transistor 5b. The collector of the transistor 19a is connected to the resistor 7a and the collector of the transistor 19c, and the collector of the transistor 19d is connected to the resistor 7b and the collector of the transistor 19b. The bases of the transistors 19a and 19c are commonly connected to an input terminal 1c which receives a digital input. The bases of the transistors 19b and 19d are connected to a reference voltage $V_{R1}'$ (this voltage can be an input having a phase opposite to that at the terminal 1c) through a terminal 1d. An input terminal 1a of the transistor 5a receives another digital input. An input terminal 1b of the transistor 5b is connected to a reference voltage $V_{R2}'$ (this voltage can be an input having a phase opposite to that at the terminal 1a). Other arrangements are the same as those in FIG. 1.

When digital inputs are supplied to the input terminals 1a and 1c, an EXNOR output appears at the terminal 2a, and an EXOR output appears at the terminal 2b.

Figure 14:
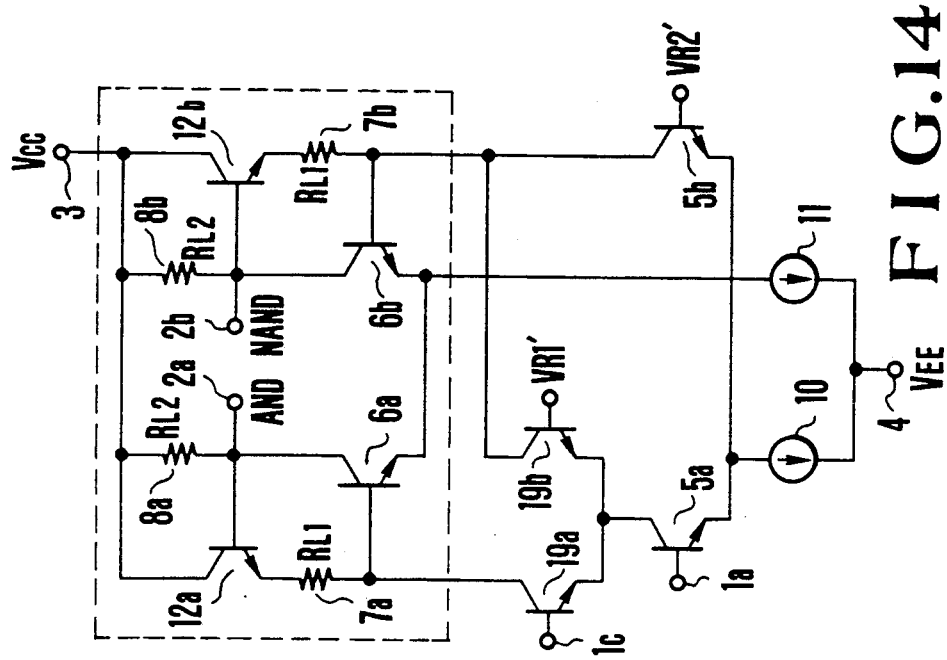

FIG. 14 shows an AND/NAND gate. The transistors 19c and 19d shown in FIG. 13 are omitted from the circuit shown in FIG. 14 to leave the transistors 19a and 19b. The collector of the transistor 19b is connected to the collector of a transistor 5b. The base inputs of the transistors 5a, 5b, 19a, and 19b are the same as those in FIG. 13. With this arrangement, when digital inputs are supplied to input terminals 1a and 1c, an AND output appears at a terminal 2a, and a NAND output appears at a terminal 2b.

Figure 15:
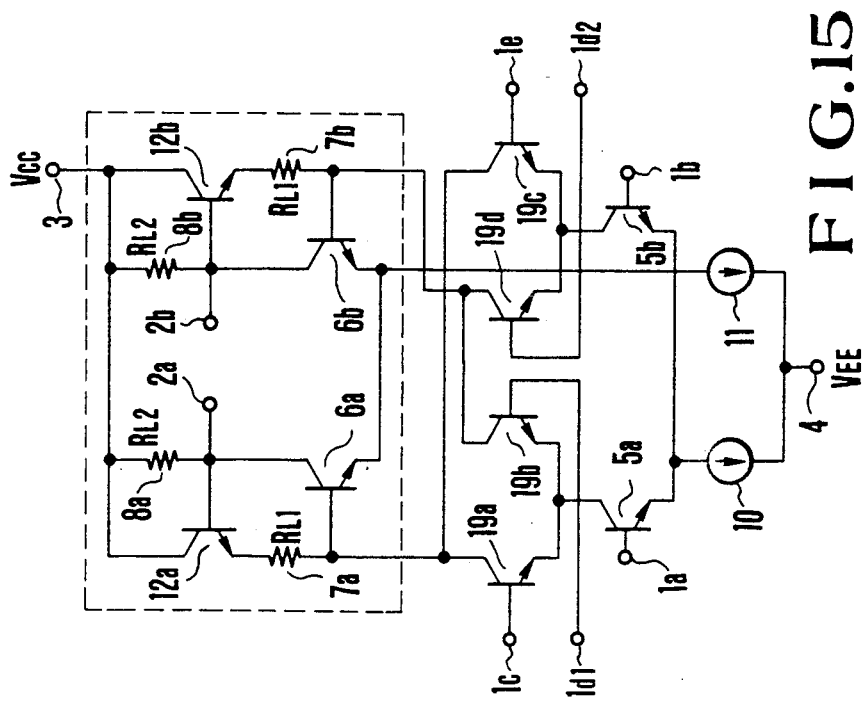

FIG. 15 shows a 2:1 multiplier. The transistors 19a and 19b, and 19c and 19d are used in the same manner as in FIG. 13 but have different I/O connections as follows. More specifically, the collector of the transistor 19a is connected to a resistor 7a and the collector of the transistor 19c, and the base of the transistor 19a is connected to an input terminal 1c which receives a digital input. The collector of the transistor 19b is connected to a resistor 7b, and its base is connected to a terminal $1d_1$ which receives a reference voltage $V_{R1}'$ or an input having a phase opposite to that at the terminal 1c. The base of the transistor 19c is connected to a terminal 1e which receives a digital input. The collector of the transistor 19d is connected to the resistor 7b and the collector of the transistor 19b, and the base of the transistor 19d is connected to a terminal $1d_2$ which receives the reference voltage $V_{R1}'$ or an input having a phase opposite to that at the terminal 1e. In this case, a terminal 1a connected to the base of a transistor 5a receives a clock signal. A terminal 1b connected to the base of a transistor 5b receives a reference voltage $V_{R2}'$ or an input having a phase opposite to that of the clock signal.

With this arrangement, digital inputs supplied to the terminals 1c and 1e are subjected to 2:1 multiplication and appear at the terminals 2a and 2b, respectively.

Figure 16:
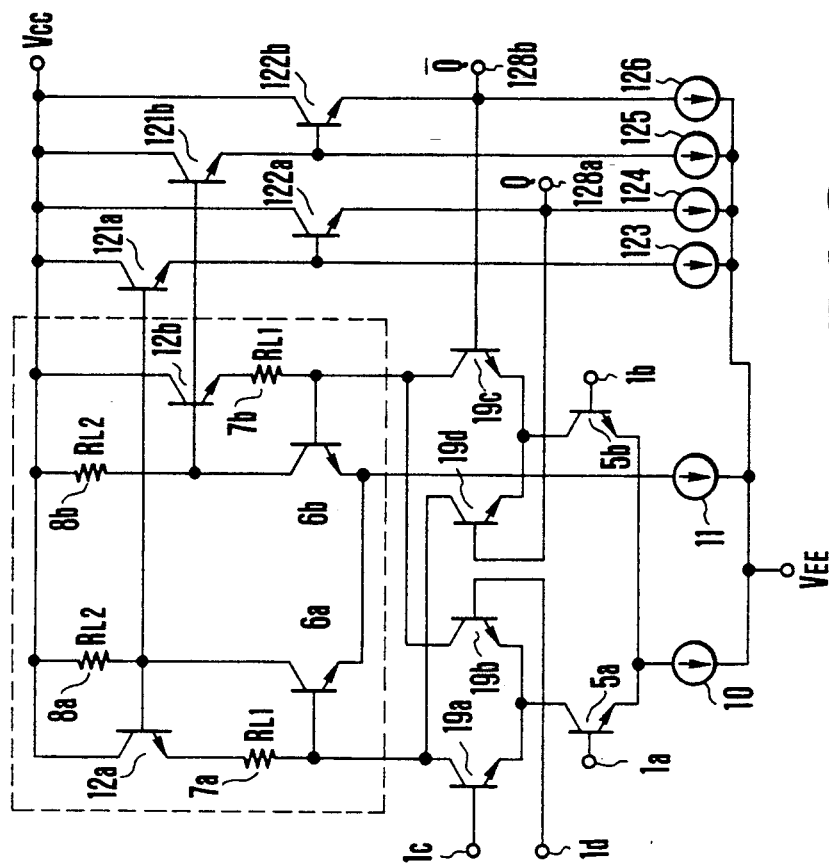

FIG. 16 shows an embodiment wherein the circuit shown in FIG. 15 is developed to constitute a D-latch. In this case, the emitters and bases of transistors 19a, 19b, 19c, and 19d are connected in the same manner as in FIG. 15 but connections of their collectors are different. More specifically, the collector of the transistor 19a is connected to a resistor 7a and the collector of the transistor 19d, and the collector of the transistor 19b is connected to a resistor 7b and the collector of the transistor 19c. Data is input to an input terminal 1c connected to the base of the transistor 19a, and a reference voltage $V_{R1}'$ or an input having a phase opposite to the data input is input to an input terminal 1d₁ connected the base of the transistor 19b. Reference numerals 121a, 121b, 122a, and 122b denote emitter-follower transistors connected in series. The emitters of these transistors are connected to a low potential $V_{EE}$ through current sources 123 to 126. The base of the transistor 19d is connected to the emitter of the transistor 122a, and a Q latch output terminal 128a. The base of the transistor 19c is connected to the emitter of the transistor 122b and a $\overline{Q}$ latch output terminal 128b.

With this arrangement, data input to the terminal 1c appears at the terminals 128a and 128b as Q and $\overline{Q}$ latch outputs.

In this manner, when the present invention is applied to the logic circuits shown in FIGS. 11 to 16, a good logic waveform shown in FIG. 8 can be obtained by the buffer effect of the transistors 12a and 12b. When a current flowed through a current source circuit of an amplifier included in a feedback load is changed, a DC output level and an output signal amplitude can be arbitrarily obtained. If the conventional circuit shown in FIG. 1 is applied to a logic circuit, since the current I₁ is flowed to the resistor 8a, it is very difficult to assure a high DC output level.

Figure 17:
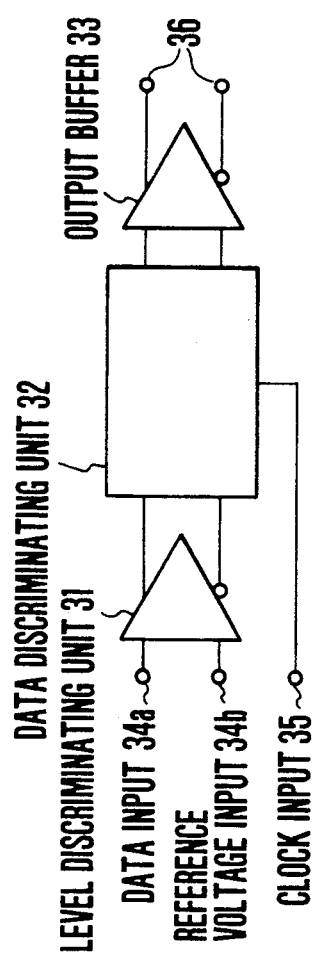
FIG. 17 is a diagram of a decision circuit to which the present invention can be applied.

FIG. 17 shows a decision circuit to which the present invention can be applied. In FIG. 17, reference numeral 31 denotes a pre-amplifier including the circuit shown in FIG. 3; 32, a data discriminating unit arranged at the output side of the pre-amplifier 31 and constituted by a master-slave type flip-flop, or the like; and 33, output buffer. Reference numeral 34a denotes a data input terminal; and 34b, a reference voltage input terminal. These terminals are connected to the inputs of the pre-amplifier. Reference numeral 35 denotes a clock input terminal for supplying a clock signal to the level discriminating unit 31. Reference numeral 36 denotes an identification output terminal. In this manner, when the circuit of the present invention is adopted as the pre-amplifier constituting the decision circuit, a high-gain, wide-band operation can be performed. Therefore, good decision sensitivity characteristics can be obtained over a wide frequency range.

The present invention can be applied to amplifier circuits having various functions such as a high-frequency amplifier circuit in addition to the above-mentioned amplifier circuits in a monolithic amplifier circuit, a hybrid amplifier circuit requiring wide-band characteristics, and the like.

In a differential amplifier circuit according to the present invention, 3-terminal amplifier elements including PNP or FETs (including MIS FETs) may be used in place of NPN bipolar transistors.

The present invention is not limited to a differential circuit but may also be applied to a single-end circuit and the like. The circuit in this case is constituted by left-hand side circuit components (1a, 2i a, 4, 5a, 6a, 7a, 8a, 10, 12a) of the differential pairs in the circuit shown in FIG. 3.

As described above, according to the present invention, since emitter-follower transistors are added as a feedback means, the buffer effect can be provided, and the following effects can be obtained.

(1) Characteristics over a larger band-width can be obtained.

(2) A bias current in a first-stage amplifier and a bias current in a transistor included in a feedback load can be separated, thus allowing easy gain design and bias design.

(3) A bias voltage at an output terminal is not changed due to the emitter follower effect. If a current source circuit of a first-stage amplifier is replaced with a variable current source circuit, the present invention can be applied to a DC direct coupling type variable gain amplifier.

(4) A bias voltage at an output terminal is not changed due to the emitter follower effect, and DC direct coupling is allowed. If an emitter resistor is added to a transistor in a first-stage amplifier and a current source circuit of the first-stage amplifier is replaced with a variable current source circuit, the present invention can be applied to a limiter amplifier which can adjust an output amplitude.

(5) If a collector application potential of an emitter follower is designed to be controllable, a peaking amount can be adjusted upon control of a base-collector junction capacitance.

(6) When the present invention is applied to a logic circuit, a good logic waveform can be obtained due to the buffer effect of a transistor arranged in a feedback system of transistors included in a feedback load.

(7) Since a high-gain, wide-band amplifier circuit can be obtained, if the present invention is applied to a decision circuit, a highly sensitive, high-speed decision circuit can be realized.

What is claimed is:

1. An amplifier circuit using a feedback load, comprising:

a first-stage amplifier including a 3-terminal first amplifier element having an input terminal and two output terminals; and a feedback load for said first-stage amplifier, wherein said input terminal of said first amplifier element receives an input signal, and one output terminal of said first amplifier element is connected to a first potential, said feedback load comprises 3-terminal second and third amplifier elements each having an input terminal and two output terminals, and first and second impedance elements, said input terminal of said second amplifier element and said first impedance element are connected to the other output terminal of said first amplifier element, one output terminal of said second amplifier element is connected to a second potential, and the other output terminal of said second amplifier element is connected to a third potential through said second impedance element, said input terminal of said third amplifier element is connected to said other output terminal of said second amplifier element, one output terminal of said third amplifier element is connected to a fourth potential, and the other output terminal of said third amplifier element is connected to said first impedance element, and an output is extracted from a connecting node between said second impedance element and said other output terminal of said second amplifier element.

2. An amplifier circuit using a feedback load, comprising two sets of circuits each comprising:
- a first-stage amplifier including a 3-terminal first amplifier element having an input terminal and two output terminals; and
- a feedback load for said first-stage amplifier,
- in which said input terminal of said first amplifier element receives an input signal, and one output terminal of said first amplifier element is connected to a first potential,
- said feedback load comprises
- 3-terminal second and third amplifier elements each having an input terminal and two output terminals, and
- first and second impedance elements, said first impedance element including a tuning circuit having a coil and a capacitor,
- said input terminal of said second amplifier element and said first impedance element are connected to the other output terminal of said first amplifier element, one output terminal of said second amplifier element is connected to a second potential, and the other output terminal of said second amplifier element is connected to a third potential through said second impedance element,
- said input terminal of said third amplifier element is connected to said other output terminal of said second amplifier element, one output terminal of said third amplifier element is connected to a fourth potential, and the other output terminal of said third amplifier element is connected to said first impedance element, and
- an output is extracted from a connecting node between said second impedance element and said other output terminal of said second amplifier element, and
- wherein said one output terminal of said first amplifier element of one of said two sets of circuits and said one output terminal of said first amplifier element of the other of said two sets of circuits are commonly connected to constitute a first differential pair commonly connected to said first potential, and
- said one output terminal of said second amplifier element of one of said two sets of circuits and said one terminal of said second amplifier element of the other of said two sets of circuits are commonly connected to constitute a second differential pair commonly connected to said second potential.

* * * * *

UNITED STATES PATENT AND TRADEMARK OFFICE
CERTIFICATE OF CORRECTION

PATENT NO. : 5,045,807

DATED : September 3, 1991

INVENTOR(S) : Ishihara et al.

It is certified that error appears in the above-identified patent and that said Letters Patent is hereby corrected as shown below:

| | | |
|---|---|---|
| col. 01, line 15 | after "high-potential" | insert -- power supply-- |
| col. 01, line 63 | delete "$C = C_L \cdot R_{L2}/(1 + gm2 \cdot R_{L2})$" | |
| col. 05, line 27, eq. (7), | after "jwc)", delete "{" | insert --}-- |
| col. 07, line 26 | delete "VPC" | insert --$V_{PC}$-- |
| col. 09, line 09 | after "connected" | insert --to-- |
| col. 09, line 64 | delete "2i a" | insert --2a-- |
| col. 10, line 51 | after "elements," | insert --said first impedance element including a tuning circuit having a coil and a capacitor-- |

Signed and Sealed this

Eighth Day of March, 1994

*Attest:*

BRUCE LEHMAN

*Attesting Officer*   *Commissioner of Patents and Trademarks*